Figure 1:
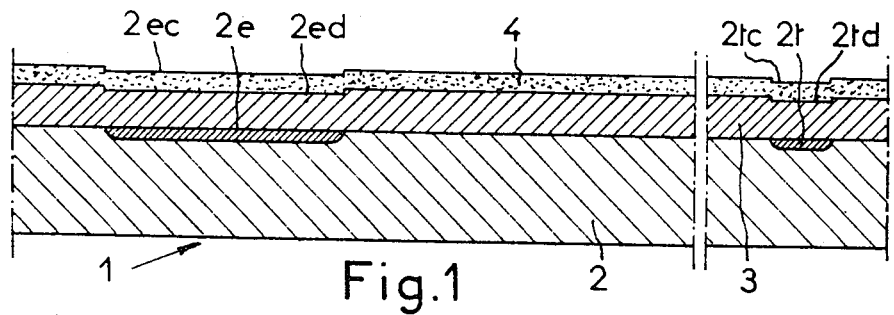

United States Patent [19]

de Brebisson et al.

[11] 4,009,057
[45] Feb. 22, 1977

[54] METHOD OF MANUFACTURING A SEMICONDUCTOR DEVICE

[75] Inventors: Michel de Brebisson, Caen; Alain Gerard Monfret, Echirolles Village; Jean-Michel Decrouen, Argences, all of France

[73] Assignee: U.S. Philips Corporation, New York, N.Y.

[22] Filed: July 22, 1975

[21] Appl. No.: 598,015

[30] Foreign Application Priority Data

Aug. 12, 1974 France .............................. 74.27905

[52] U.S. Cl. .................................. 148/1.5; 148/175; 148/187

[51] Int. Cl.² ...................................... H01L 21/265

[58] Field of Search ..................... 148/1.5, 175, 187

[56] References Cited

UNITED STATES PATENTS

| 3,560,278 | 2/1971 | Sanera | 148/187 |
|---|---|---|---|
| 3,640,782 | 2/1972 | Brown et al. | 148/187 |
| 3,697,318 | 10/1972 | Feinberg et al. | 148/187 UX |
| 3,775,192 | 11/1973 | Beale | 148/1.5 |
| 3,793,088 | 2/1974 | Eckton, Jr. | 148/1.5 |
| 3,833,429 | 9/1974 | Monma et al. | 148/1.5 |
| 3,858,304 | 1/1975 | Leedy et al. | 148/1.5 UX |

Primary Examiner—L. Dewayne Rutledge
Assistant Examiner—J. M. Davis
Attorney, Agent, or Firm—Frank R. Trifari; Leon Nigohosian

[57] ABSTRACT

A method of manufacturing a semiconductor device, in which on a basic mask of a first material there is provided a layer of a second material, after which the first material with the second material present thereon is removed, and an island of the second material remaining with a window of the basic mask is used as an alignment feature for a subsequent mask.

12 Claims, 16 Drawing Figures

METHOD OF MANUFACTURING A SEMICONDUCTOR DEVICE

The present invention relates to a method of manufacturing a semiconductor device in which a first masking layer of a first material is provided on a substantially flat surface of a semiconductor body, from which layer a basic mask having at least one window is formed.

The invention furthermore relates to a semiconductor device manufactured according to the method.

It is known that a large number of semiconductor devices are manufactured from a major surface of a semiconductor plate on which or in which a given number of treatments, such as deposition, diffusion, implantation, and so on, are carried out.

Most treatments should be carried out locally, which is done by means of a series of masks which are obtained photographically.

In order to establish the terminology of this application it is of importance to summarize the steps of this process. Photolacquer is to be understood to mean herein a substance which, under the influence of radiation, for example, ultraviolet or electron radiation, either depolymerises (positive photolacquer) or polymerises (negative photolacquer). In both cases the non-polymerised product can more easily be removed by dissolving than the polymerised product.

For the use thereof in semiconductor technology, the photolacquer is deposited on the surface of the plate and converted in certain regions by local irradiation via a photographic mask the circumference of which is that of the desired mask.

The photolacquer is then removed from the place where it has not polymerised by dissolving.

The pattern obtained by this definition may then be used as a mask, for example, an ion implantation mask.

The whole of the treatments which results in obtaining such a mask is hereinafter termed "photodefinition".

The resulting pattern may also be used as a mask for an etching treatment of an underlying masking layer which was previously deposited on the semiconductor plate.

This assembly of treatments is referred to as photomasking and is usually applied recurrently for the formation of a semiconductor structure.

It is obvious that during this long progress the mutual positions of the windows which are provided in various stages have to be determined in the most accurate manner and that it is hence necessary to dispose of alignment features.

For various reasons it is not opportune to use as alignment features the patterns used for the formation of the device (emitters, bases, and so on), even so because said patterns usually are too small and it is preferred to have the disposal of special alignment patterns, of suitable shape and dimensions at the edge of the surface occupied by the device on the plate.

The place of a buried layer is easy to determine; actually, the oxidation of the diffusion surface during the deposition produces a slight cavity of the surface of the plate, in the order of 0.05 $\mu$ depth, which cavity is maintained during the epitaxy and the formation of the masking layer. It is the sides of said cavity which are used to position the masking layer. The following determinations of the position are carried out starting from windows provided especially in the masking layer. In each treatment the photomask is positioned starting from a given alignment feature. This mask itself comprises another alignment pattern starting from which the following photomask is positioned, in which the deterioration caused by the various treatments, especially by the etching treatment, prevents the use of the same alignment mask during the whole process. So the alignment occurs more or less stepwise.

The possibility of accumulation of errors in the position of the successive masks necessitates the increase of the dimensions of the elements and the distance between them.

Furthermore, the increasingly complicated character of integrated circuits results in an increasing number of masking treatments, which involves a stack of layers. According as the number of layers present one on top of the other increases and these can vary from one point of the plate to the next as a result of the various etching treatments, the accuracy of the photographic etching decreases. Furthermore, the differences in height formed by the large number of layers at the end of the manufacture may cause fracture of the contacts and of conductive connections formed on the plate.

On the other hand, the present tendency of the development of integrated circuits tends more and more towards miniaturization and increasing of the reproducibility of the characteristics. For example, ever higher frequencies are desired and according as the frequencies used become higher, the dimensions of the regions to be formed and the distances between them must become smaller and the accuracy of the dimensions larger.

In this connection it is endeavoured to reduce the occupied surfaces in such manner that in transistors the collector-substrate and the base-collector capacitances are reduced. The manufacture of high frequency transistors in integrated circuits presents numerous difficulties.

It is endeavoured more and more to perform various treatments on the same circuit from the same series of windows; this is termed "self-registration".

One of the objects of the invention is to reduce the number of photodefinitions and the number of etching treatments to a minimum.

The present invention is inter alia based on the recognition of the fact that this can be achieved in a simple manner in that, starting from a basic mask which may be used for successive doping treatments, an alignment feature is formed from a mask or mask portion which is not attacked by etching treatments and the like and is therefore in a good shape.

According to the invention, a method of the kind described in the preamble is characterized in that a layer of a second material is provided parts of which are present on the first material and at least a part is present on the semi-conductor surface within the window, and the first material together with the parts of the second material present thereon are then removed so that an island of the second material on the semiconductor surface remains present only within the circumference of the window, and that a further mask is then provided, for the formation of which the said island is used as an alignment feature related to the basic mask.

So during this process successively the windows that were open are partly (and usually totally) closed, and those which were closed are opened.

An island thus formed and projecting from the surface of the plate may serve for determining the position of the photomask for the next treatment.

It is also possible to form other protective layer portions around the thus projecting islands with which the said islands on the plate constitute a composite layer in which the various islands mark the places to be maintained.

The island may also form alignment patterns, this time in "bass-relief" relative to the visible surface.

Once the said composite layer has formed, the said island or a part of the said island or a part of the said islands may be removed to convert the said composite layer into a mask which is at least partly the image of the basic mask, the said mask comprising a window which corresponds to that in which the said island is formed. So a doped or contacted region may be formed in a place defined from the beginning by means of a window of the basic mask and may be completed at the end of the process through the original window. A region may be doped or a contact be provided very accurately.

As a first material may preferably be used silicon oxide and as a second material may be used silicon nitride. As a second material may also be used metals, such as molybdenum, tungsten, nickel, chromium, and so on.

In the case of a plate of silicon, silicon oxide may be obtained by deposition or thermally.

The deposition of silicon nitride may be carried out either by cathode sputtering or chemically and the nitride may be obtained by etching with warm orthophosphoric acid (for example at 145° C for diluted acid with 10% water), which solution neither attacks silicon oxide nor the silicon itself.

In a particularly favourable embodiment of the invention a layer of a third material, for example, a photolacquer, is provided on the surface prior to the provision of the second material, said third material being present partly on the basic mask and partly leaving a part of the said window free. The second material is then deposited of which certain layer portions bear on the said first material, other portions on the said third material, and of which certain islands are deposited on the bottom of the windows on the simultaneously free faces of the surface of the plate of the covering layer and of the mask.

The third material is then removed, for example, by etching, and then the first material is removed, the parts of the said second layer present thereon being also removed and the desired islands of the second material remaining intact.

This variation has several advantages. It enables the faster etching of the first material. This material which is to be subjected to numerous treatments inevitably has a certain chemical hardness, while the said third material can easily be removed. Large parts of the mask are then exposed and may be etched chemically.

As a third material is preferably used a photolacquer which can be dissolved or be removed by plasma sputtering in oxygen. After depositing silicon nitride, the removal of the photolacquer is facilitated by the cracks which are caused in the photolacquer by the presence of the nitride.

This embodiment enables the formation in the basic mask of islands having an area smaller then that of the windows of the basic mask in which they are provided and thus, for example, the marking of the place of contacts to be provided afterwards.

It is also possible to form doped regions by implantation via the composite layer consisting of the islands and masking parts of a fourth layer, if desired determined by a mask of a fifth material. In this case it may be of advantage when the masking effects of on the one hand the thickness of the fourth material and on the other hand that of the islands for the ions used are equal to such an extent that the implantation occurs at a uniform depth.

In a slightly different case, in which a doped region has already been formed below the said island by means of a dopant which itself forms an obstacle for the ions, it may be equally advantageous that the masking effect of the thickness of the fourth material be equivalent to the sum of the masking effects of the island and of the underlying doped zone.

The present invention may be used in particular for the manufacture of integrated circuits, especially for very high frequencies.

Experience teaches that the method according to the invention enables the positioning treatments to be reduced considerably, possibly to one single treatment, which makes it possible to reduce the distances between the regions to their minimum value; actually any addition of the tolerances made necessary by all possible shifts need not be taken into account.

The invention will be described in greater detail with reference to the accompanying drawings, in which:

FIGS. 1 to 12 show the various stages of the manufacture of a semiconductor device having an npn high frequency transistor and a resistor in an integrated circuit by using the method according to the present invention. The FIGS. 6a to 9a relate to a variation of said method.

It is to be noted that, for reasons of clarity, the FIGS. are not drawn to scale and are shown diagrammatically only.

It should also be noted that although the present example relates to a device of which several regions are obtained by implantation, the present invention may also be applied readily to other methods, in which, for example, said regions are formed by diffusion.

Reference numeral 1 in FIG. 1 denotes a silicon plate, whose substrate 2 can be p-type and bears an epitaxial layer 3 of the n-type having a thickness between 1 and 2.5 microns, for example 1.5 microns. The plate is preferably oriented in the (111) direction.

The buried n-type collector zone 2e and the buried n-type reference zone 2t were previously formed, the recesses 2ed and 2td being formed on the surface of the epitaxial layer 3.

A first masking layer 4 of a first material, in this case thermal oxide having a thickness of 0.8 micron is formed on the epitaxial layer 3 which is impervious to the subsequent ion implantations.

At the surface of the layer 4 the positions of the buried zone 2e and those of the reference zone 2t are also marked by cavities 2ec and 2tc having a depth of approximately 0.05 micron.

Said reference cavities in an oxide layer of 0.8 micron enable the determination of the position of the photomask with which the next mask is formed.

The reference zone 2t and the cavities determined by the buried zones are stated here pro forma for they are of no further interest for the invention. Therefore, for clarity, the said zone 2t, the cavities 2ec and 2tc and the recesses 2ed and 2td are not shown in the following Figures.

Starting from the said cavity 2ec which is used as a positioning feature, the basic mask is provided to carry out the following operation.

By a known photolithographic method, the series of windows 5 are opened in the said layer 4 of which the windows $5a_1$, $5a_2$ and $5a_3$ are destined to form the p+ type insulation walls, the window 5b to form the n+ type collector contact, the window 5c to form the n+ type emitter, the window 5d to form the p+ type base contact, the window 5e to form a resistor and the windows 5f and 5g to form two positioning patterns.

Figure 2:
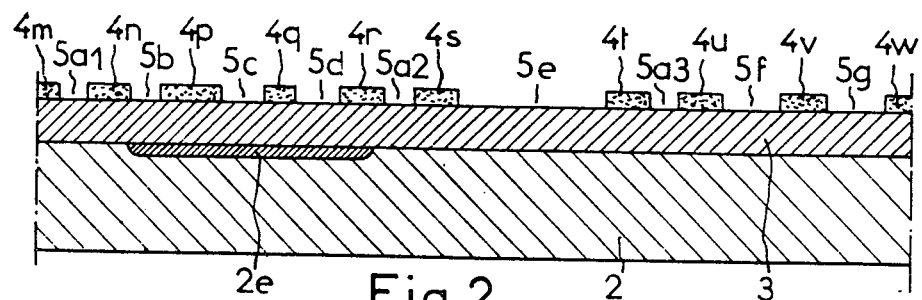

Opening said windows 5 separates, in the plane of FIG. 2, the masking layer 4 in parts 4m to 4w which, however, cohere together outside the plane of the drawing.

The quality of said first photolithographic etching process which can easily be carried out and is particularly accurate because it is carried out on a flat surface and in a uniform layer, makes it particularly suitable to form said basic mask which comprises all the windows necessary to form the various regions.

Starting from the window 5f a photolacquer mask 6 is formed on the plate. This is given a thickness which exceeds 1 micron, so as to make it impervious to the ions to be implanted.

Figure 3:
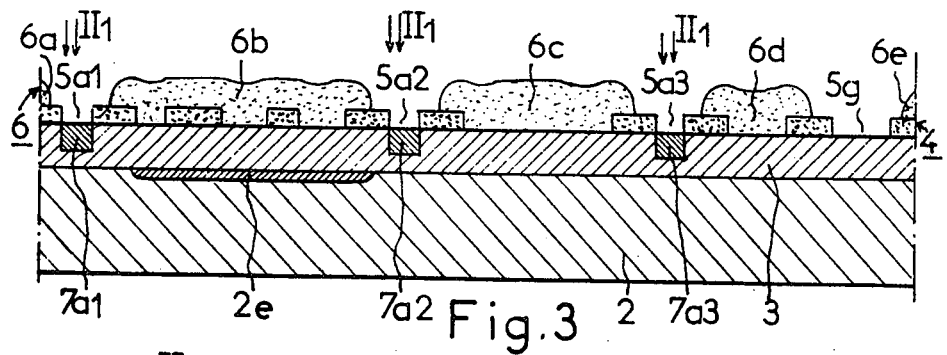

The parts 6a to 6e of said mask are shown in FIG. 3. The mask 6 does not cover the windows $5a_1$, $5a_2$ and $5a_3$ via which an ion implantation $II_1$ with boron ions is then carried out the energy of which is between 100 and 200 KeV, for example, 150 KeV, in order that the implantation reaches a depth between 0.8 and 1.2 microns from the surface; the implanted doses are between $5 \times 10^{14}$ and $5 \times 10^{15}$ atoms/sq.cm, for example $10^{15}$ atoms/sq-cm; the implanted regions are denoted by $7a_1$, $7a_2$ and $7a_3$ in FIG. 3.

This mask 6 also does not cover the window 5g. The boron ions which penetrate through said window form an implantation which is of no importance and which is therefore not shown in the Figures.

Because no photoetching treatment has taken place, the edge of said window 5g can hardly be deformed and the said window may be used to position the next mask.

Figure 4:
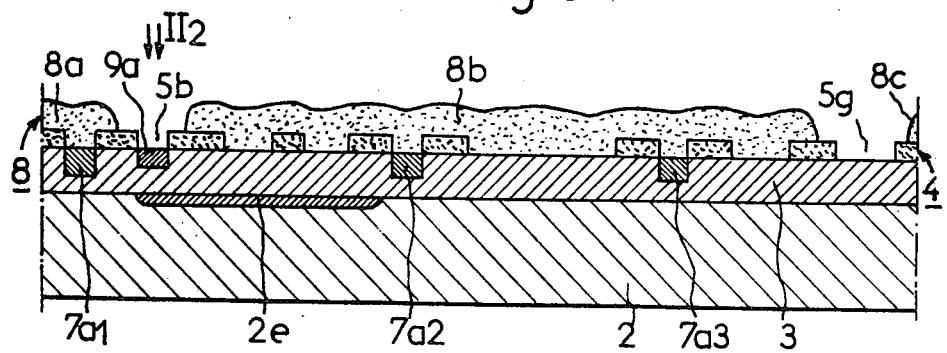

After removing the mask 6, for example, by plasma sputtering in oxygen, a new mask 8 of photolacquer is formed in a thickness of 1 micron, the parts 8a, 8b and 8c of which, which are shown in FIG. 4, do not cover the windows 5b and 5g and are impervious to the ions to be implanted which serve to form the n+ type collector contact.

For said implantation $II_2$ phosphorus ions are advantageously used with an energy between 130KeV and 260KeV and preferably of 170KeV.

The dose is preferably between $10^{15}$ and $5 \times 10^{15}$ atoms/sq.cm and is, for example $2 + 10^{15}$ atoms/sq.cm.

The implantation below the window 5b has a depth between 0.6 and 0.8 micron and is denoted by 9a, while the implantation below the window 5g is not shown.

The mask is then removed from the plate and a diffusion is carried out of the zones by heating in nitrogen, for example at a temperature of 1100° C for 30 minutes.

The p+ type implantations $7a_1$, $7a_2$ and $7a_3$ diffuse and form the p-type walls $7b_1$, $7b_2$ and $7b_3$ which extend down to the p-type substrate 2; the n-type implantation diffuses and forms the n+ type collector contact 9b which extends down to the buried zone 2e1 which itself is slightly diffused.

Figure 5:
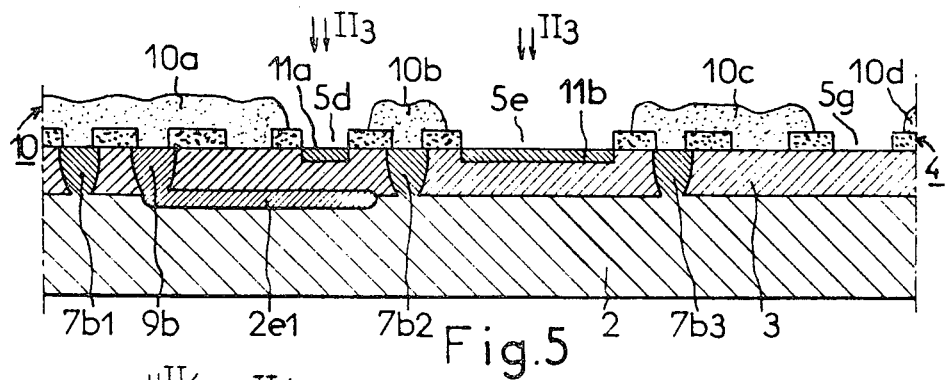

Subsequently, again starting from the alignment position of the window 5g, a new photolacquer mask 10 is formed on the surface of the plate in a thickness equal to or larger than 0.6 micron which does not cover the windows 5d, 5e and 5g and of which in the plane of FIG. 5 parts 10a, 10b, 10c and 10d are shown.

By an implantation $II_3$ of boron ions having an energy in the order of 20KeV, the base contact zone 11a is formed via the window 5d and the zone 11b is formed via the window 5e, which latter zone forms part of the resistor. The dose used is, for example, $3 \times 10^{15}$ atoms/sq.cm, which involves an implantation depth of 0.4 micron. The implantations via the window 5g are not shown either in FIG. 5, which Figurs shows the plate in this stage of its manufacture.

After removing the mask 10 a second thermal treatment is carried out, if desired, in nitrogen, for example, at 950° C for 15 minutes. Still starting from the alignment position of the window 5g which has not deteriorated during the preceding treatments, a new photolacquer mask 12 is then formed on the surface of the plate in a thickness larger than or equal to 0.6 micron of which the parts 12a to 12c are shown in FIG. 6.

The said mask 12 does not cover the windows 5b to 5g as well as the parts 4p and 4v of the masking layer 4 which are impervious to ions. The material of the mask 12 forms the already mentioned third material.

An implantation $II_4$ (FIG. 6) is carried out with a dose in the order of $3 \times 10^{15}$ atoms/sq.cm of arsenic ions with an energy of approximately 80KeV which penetrate down to a depth of approximately 0.2 micron. As a result of this, the n+ type emitter region 13 is formed via the window 5c.

Figure 6:
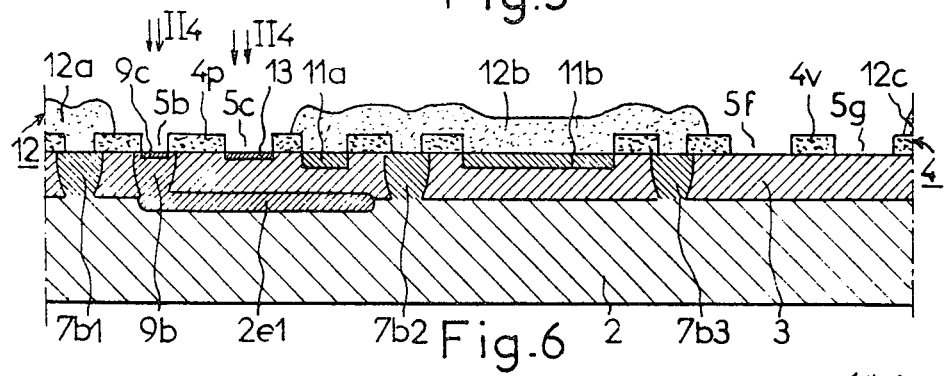

Simultaneously, an overdoping of the collector contact is carried out via the window 5b which is favourable and is denoted in FIG. 6 by 9c, while via the windows 5g and 5f again an implantation is obtained which is not shown in the Figures.

The opening of the windows 5b, 5c, 5f and 5g in this stage makes it possible to carry out a given number of self-registering alignments.

Figure 7:
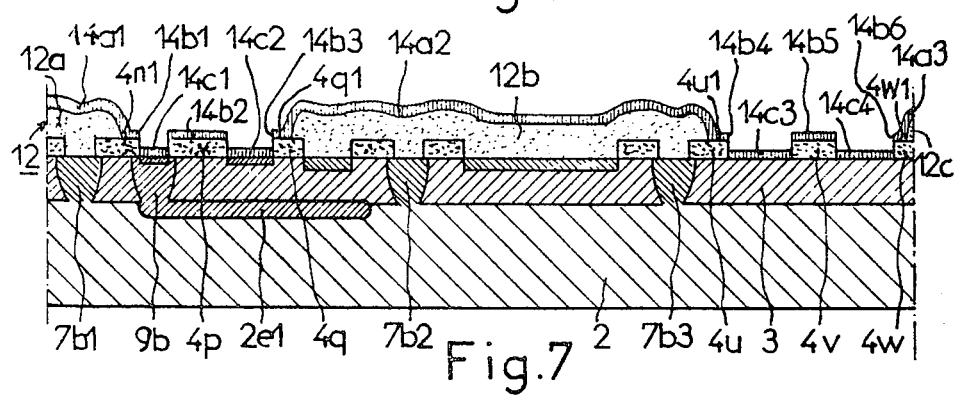

According to the present invention the following operation the result of which is shown in FIG. 7 actually consists of the vapour deposition, for example, in a vacuum of a layer 14 of the already mentioned second material, in this case of silicon nitride, in a thickness of 0.5 micron, on the surface of the plate which still bears the mask 12 and the masking layer 4. Certain parts of said layer 14 are deposited on the photolacquer mask 12, part $14a_1$ of the layer 14 being present on the part 12a of the mask 12, part $14a_2$ being present on the part 12b and part $14a_3$ being present on the part 12c.

Other parts of said layer 14 may be deposited on the free surface parts of the masking layer 4, the edge $14b_1$ of the part $14a_1$ being present, for example, on the surface part $4n_1$ of the part 4n of the layer 4, part $14b_2$ being present on the part 4p, the edge $14b_3$ of part $14a_2$ bearing on the surface part $4q_1$, and so on.

Finally, parts of the layer 14 which are deposited within the windows 5b, 5c, 5f and 5g constitute the islands $14c_1$, $14c_2$, $14c_3$ and $14c_4$, respectively. It is these islands which serve for the self-registration during the positioning.

The various deposits do not constitute continuous layers. Fracture occurs along the height differences, especially when the slopes of said height differences are steep, which is the case with the edge of the layer parts 12a, 12b and 12c. Fracture also occurs along the edges of the layer parts 4n, 4p, 4q, 4u, 4v and 4w of the masking layer 4, the thickness of said layer 4 (0.8 micron) being significantly larger than that of the layer 14 (0.1 micron). Furthermore, the temperature at which the layer 14 is deposited involves cracking of the photolacquer.

The mask 12 and the parts $14a_1$, $14a_2$ and $14a_3$ of the layer 14 present thereon are then removed. Said removal can easily be carried out by plasma sputtering in oxygen; taking into consideration the cracking of the photo-lacquer, this may also be carried out chemically.

The masking layer 4 is then removed by etching by means of hydrofluoric acid solution buffered with ammonium fluoride, of which layer the layer parts 4n, 4p, 4q, 4u, 4v and 4w are etched by underetching and take along the parts $14b_1$, $14b_2$, $14b_3$, $14b_4$, $14b_5$ and $14b_6$ of the layer 14 of silicon nitride.

Figure 8:
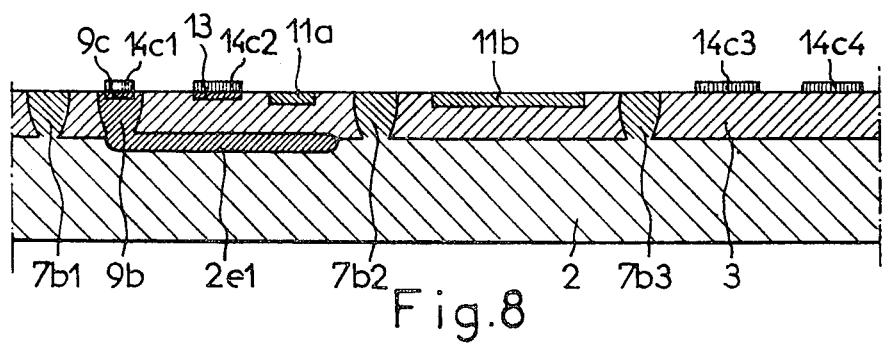

The islands $14c_1$, $14c_2$, $14c_3$ and $14c_4$ of the layer 14 remain on the surface of the plate, see FIG. 8.

The plate has now been fully cleaned with the exception of said alignment islands.

The islands $14c_3$ and $14c_4$ are used as reference patterns for the masks to be provided afterwards. The island $14c_1$ denotes the place of the collector contact and protects it, and the island $14c_2$ denotes the place of the emitter.

Figure 9A:
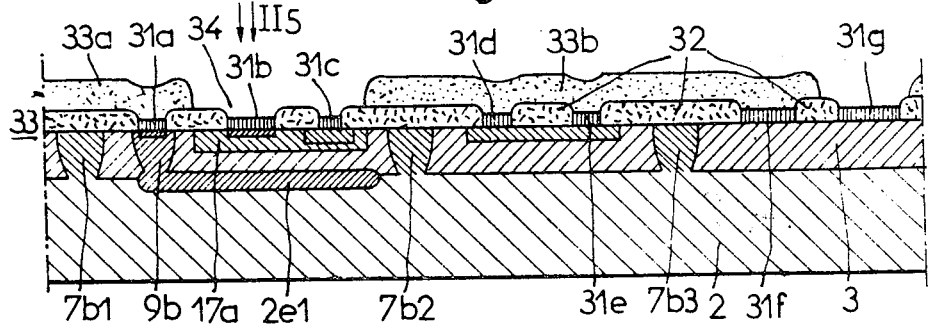
Figure 9:
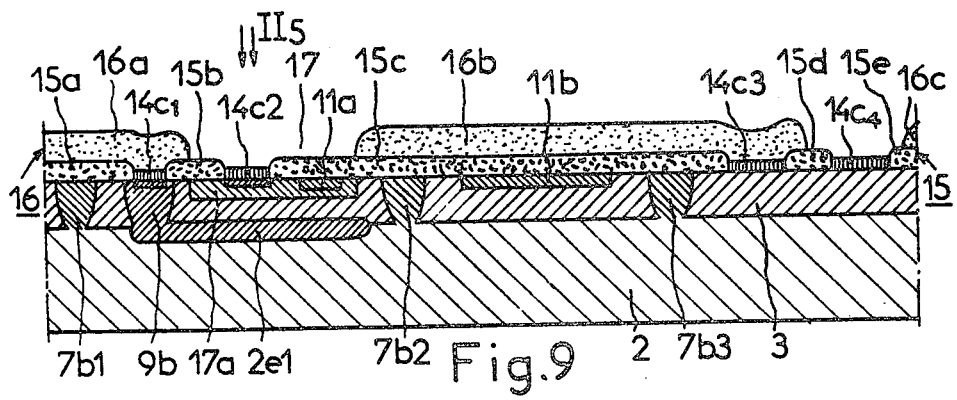

The layer parts of the passivating layer 15 which is shown in FIG. 9 are formed by oxidation of silicon. Said layer 15 should be at least partly pervious to the ions to be implanted to form the base of the transistor. In order to obtain a collector-base junction which is parallel to the emitter-base junction and hence to avoid possible drawbacks of a non-parallelism of the two junctions (deformation of the characteristics and in particular breakdown through the base), the passivating layer 15 is given such a thickness that the masking effect for the ions is equal to that of the layer 14.

In the present example in which the said layer 14 (FIG. 7) is of silicon nitride and has a thickness of 0.1 micron, the layer 15 should therefore have a thickness of preferably approximately 0.17 micron. Said oxide layer 15 can be obtained by thermal oxidation, for example, by maintaining the plate of silicon at a temperature of 1000° C for 10 minutes in an atmosphere of dry oxygen, then 15 minutes in moist oxygen and finally again in dry oxygen for 5 minutes.

Said thermal oxidation treatment simultaneously realizes the annealing necessary for the emitter zone.

It will be obvious that the silicon oxide layer 15 is not formed in places which are covered by the islands $14c_1$, $14c_2$, $14c_3$ and $14c_4$ of the layer 14 but immediately around these and that said places remain marked. As a result of this the layer 15 in the plane of FIG. 9 and the following Figures is divided into five zones: 15a to 15e.

A photolacquer layer 16 is deposited on the layer 15 in such a thickness as to be impervious to the ions which are used in the subsequent implantation, that is a layer having a thickness larger than or equal to 0.6 micron. A window 17 is provided photographically in said layer 16 and the position of said window is determined starting from one of the alignment islands $14c_3$ or $14c_4$; the said window 17 divides the layer 16 into three zones 16a, 16b and 16c in the plane of FIG. 9.

The base implantation 17a having a depth of 0.30 micron is then formed by a boron implantation $II_5$. Said implantation is carried out with a dose of $5 \times 10^{13}$ atoms/sq.cm with boron ions having an energy of 70 KeV.

The plate in this stage is shown in FIG. 9.

The layer 16 is then removed and a diffusion heating is carried out. The base then assumes the shape 17b having a depth of 0.4 micron. Said heating is advantageously carried out in nitrogen at a temperature of 1000° C for 15 minutes.

The islands $14c_1$, $14c_2$, $14c_3$ and $14c_4$ are removed by means of a phosphoric acid bath, as a result of which the windows 18a, 18b, 18c and 18d are formed at the area of the collector contact, the emitter and in the two alignment places.

A new photolacquer layer 19 is then deposited on the plate in a thickness of approxmately 1 micron.

In said layer 19 is formed an aperture 20a opposite to the zone 11a of the base contact and two apertures 20b and 20c opposite to the resistor 11b, of which apertures the respective positions are determined starting from the alignment feature 18d;

Said positions need otherwise not be established very accurately.

Figure 10:
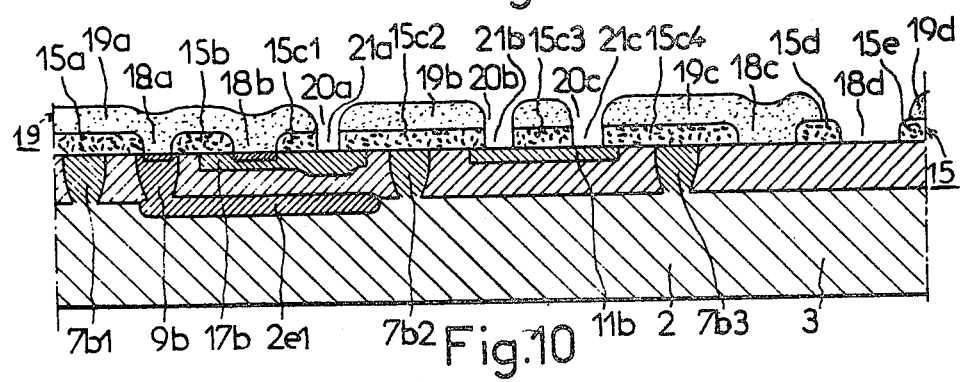
Figure 11:
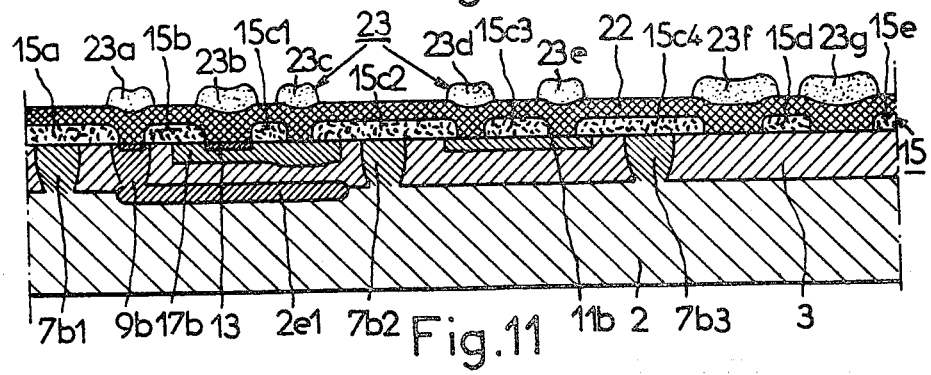

An etching process is furthermore carried out via the said apertures 20a, 20b and 20c, the first etching since that of the initial masking layer 14, so as to provide in the oxide zone 15c the windows 21a to 21c which, in the plane of FIG. 10, divides the layer portion 15c into four parts $15c_1$, $15c_2$, $15c_3$ and $15c_4$.

The lacquer layer 19 is then removed; the plate is rinsed according to a known method and an aluminium layer 22 is deposited by a vacuum deposition in a thickness of 0.7 micron and then a photolacquer layer 23 which has a thickness of approximately 1 micron.

Said layer 23 is divided into layer parts 23a to 23g by photodefinition.

The provision of said layer parts 23a, 23b and so on is carried out as is usual in said stages of the manufacture starting from the cavity of the aluminium layer 22 at the area of one of the original alignment patterns.

The superfluous parts of the aluminium layer 22 are then removed by etching and the contacts 22a on the collector 9b, 22b on the emitter 13, 22c on the base 17b, 22d and 22e on the resistor 11b are left.

Figure 12:
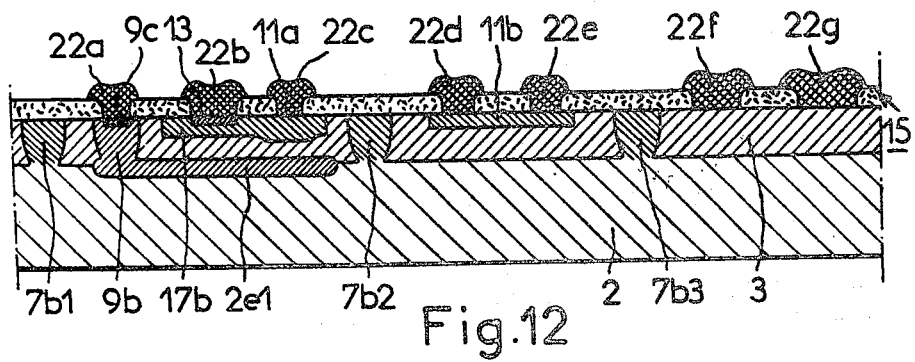

The aluminium deposits 22f and 22g are preferably also left in the alignment places because they may be useful afterwards, especially if a protective film is deposited on circuit elements of the structure. The finished device is shown in FIG. 12.

Due to the substantially entirely flat character of the passivating layer 15, fractures are avoided in conductive connections which inevitably occur in known methods due to differences in height.

In this example, in which the method according to the invention is used three times, it may be established that by providing in the basic mask one or more reference recesses around which the next mask is provided, preferential places the position of which is certain are marked during the operation.

Starting from a given number of said places, namely from those of the reference patterns, the position of the later photomasks is determined without one single etching process spoiling the alignment edges. As a result of this the number of alignment patterns may, if desired, in principle even be reduced to one.

However, in order to be ensured of an optimum accuracy of the positioning of the masks, preferably two alignment patterns are used. In the embodiment described with reference to FIGS. 1 to 12 the window 5g (afterwards 18d) may be used without objection until the stage which corresponds to FIG. 10.

After the chemical etching treatment which results in the formation on the windows 21a, 21b and 21c, the edges of the window 18d are seriously attacked, while those of the window 18c which are protected by the mask 19 remain unattacked. From that instant on it is hence preferable to use the window 18c (originally 5f) as a reference sign for later positioning.

It is to be noted that none of the positionings of the photolacquer masks need be carried out with a very high accuracy because the basic mask 4 simultaneously determines all the positions; the etching of said mask which occurs on a flat layer can be carried out very accurately. On the other hand, around the islands 14c1 to 14c4 there may be provided a new clean masking layer 15 which has a sharp circumference and is flat and increases the reliability, especially that of the quality of the surface state and of the security of the connections.

The self-registering alignment of the collector and emitter contact can be obtained in a very good manner. The positions of the base and the emitter of the transistor are determined without error from the beginning.

The number of photomasks may be reduced to two and the number of photodefinitions may be reduced to five.

The position determination which requires the greatest accuracy is that of the base contact of the transistor. The following variation of the method may even further improve the use of the method according to the invention in this respect.

According to said variation, the method is the same up to and including FIG. 6.

Figure 6A:
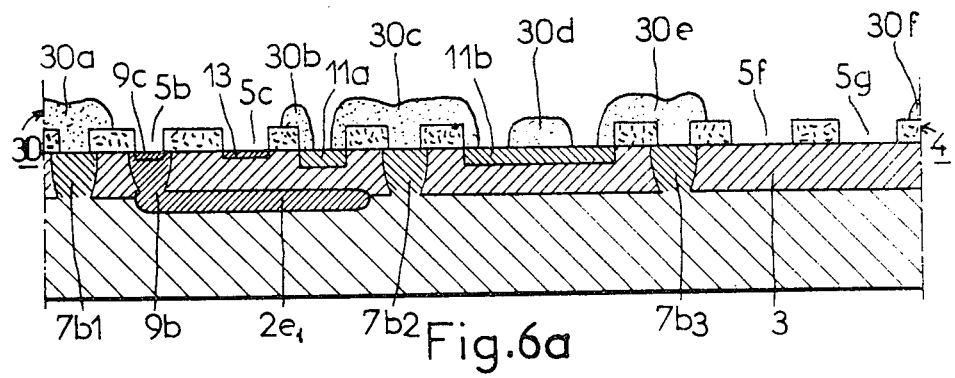

Then the photolacquer mask 12 is removed and replaced by a new mask 13 the parts 30a to 30f of which are shown in FIG. 6a. The mask 30 is positioned starting from the window 5g.

The mask 30 does not cover the surface of the collector contact 9c, as well as the surface of the emitter 13, a part of the surface of the zone 11a of the base contact, a part of the surface of the zone 11b corresponding to the resistor, and the surface regions of the plate which are present in the windows 5f and 5g.

Figure 7A:
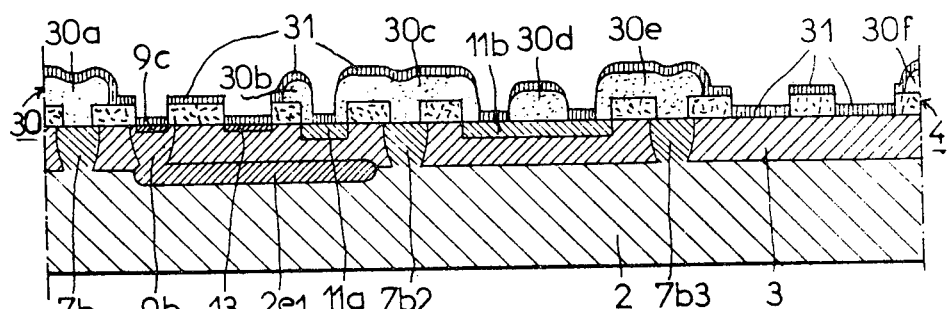

A layer 31 of silicon nitride having a thickness of 0.1 micron is then deposited over the whole surface of the plate. The plate in this stage is shown in FIG. 7a.

As in the preceding example, the mask 30 and the layer 4 are removed. The silicon nitride islands 31a to 31g remain.

Figure 8A:
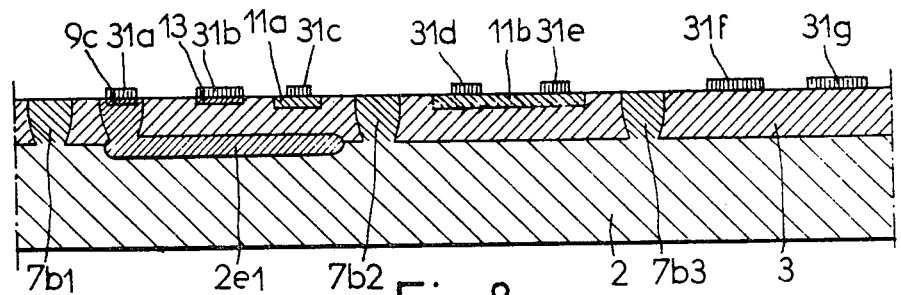

The plate in this stage of its manufacture is shown in FIG. 8a.

By thermal oxidation, the passivating layer is then formed, which is shown in FIG. 9a, in a manner analogous to the layer 15 of the preceding example (FIG. 9) and has a thickness of 0.17 micron, in such manner that said layer has the same masking effect for ions as the silicon nitride layer of the islands 31.

The photolacquer layer 33 is then deposited on the plate in such a thickness (1 micron) that same is impervious to the ions which are used to be implanted in the base of the transistor. Provided in said layer 33 is the window 34 the position of which is determined starting from the island 31g.

The window 34 is in the plane of the drawing between the two parts 33a and 33b of the layer 33.

A boron implantation II5 is then carried out in the same circumstances as those which are described in the first Example to form the base 17 of the transistor.

After removing the layer 33 and the islands 31a, 31b, 31g and after a diffusion treatment of the base 17b in the circumstances of the first example, the structure is covered with an aluminium layer and with a photolacquer mask of which the parts are present opposite to the contact surfaces of the transistor and the resistor and possibly the alignment zones of the windows 18c and 18d. The circumstances are then identical to those of FIG. 11 and the manufacturing process is continued as described above the finished device corresponds to that of FIG. 12.

It should be noted that in the above-described embodiments the resistor 11b was manufactured simultaneously with the zone 11a of the base contact. When the ion dose which is used to implant the said zone 11a is high, a resistor 11b is obtained having a low resistance value. If it is desired for the resistor 11b to have a higher value, it is to be preferred to manufacture same simultaneously with the base 17b, so slightly later.

It will be obvious that in critical cases, for example, during the formation of a resistor having a highohmic value, a specific series of treatments is necessary which can easily be integrated in the above-described methods.

Said method makes it possible to obtain a greater accuracy with a simpler process.

The known method actually comprises seven photos, seven photo definitions with six positionings, which are all important and difficult to carry out. Positionings which are difficult to perform should be understood to mean that since the necessary accuracy is great, an expensive machine has to be used for carrying out by means of said machine an accurate, long-lasting alignment and that high rejects are inevitable.

In a first embodiment the method according to the present invention comprises seven photos, of which five for the photo definitions and two for the photomaskings and a single positioning treatment, while the embodiment according to the variation described comprises only one single photomasking.

As a result of this, the required surface parts can be reduced which enables a miniaturization and on the other hand enables the substrate-collector capacity and the collector-base capacity to be reduced and the admissible frequencies to be increased. Furthermore, the input impedance of the base is reduced. With the same tolerance, a much larger reproducibility is available.

We claim:

1. A method of manufacturing a semiconductor device, comprising the steps of:
   a. providing a semiconductor body having a substantially flat surface,
   b. providing a first masking layer of a first material on said surface,
   c. forming from said layer a basic mask having at least one window,
   d. providing a second layer of a second material, parts of said second layer being disposed on said first material and at least a part thereof being present on said semiconductor surface within said window,
   e. removing said first material together with the parts of said second material present thereon so that an island of said second material remains on the semiconductor surface and is present only within the circumference of said window, and f. providing a further mask utilizing said island as an alignment feature related to said basic mask.

2. A method as in claim 1, wherein prior to the provision of said second material, there is provided a further mask of a third material, said further mask being present partly on the basic mask and not covering at least one said window at least partly, after which said layer of second material is provided and then, first, said third material and the parts of said second material present thereon are removed, after which said first material with the parts of said second material present thereon are removed.

3. A method as in claim 1, wherein said island of said second material, which serves as an alignment feature, is provided on the entire part of said semiconductor surface present within said window.

4. A method as in claim 1, wherein said first material is silicon oxide.

5. A method as in claim 1, wherein said second material is silicon nitride.

6. A method as in claim 1, wherein said second material is a metal selected from the group consisting essentially of tungsten, molybdenum, nickel and chromium.

7. A method as in claim 2, wherein said third material is a photolacquer.

8. A method as in claim 1, wherein for the formation of said further mask, a passivating layer is provided on the parts of said semiconductor surface not covered by said island, said passivating layer constituting a composite layer together with said island.

9. A method as in claim 8, wherein after providing said passivating layer, at least one said island is removed from said second material so as to form in said passivating layer a further mask having at least one aperture which corresponds to a window of said basic mask.

10. A method as in claim 9, wherein a dopant is introduced into said semiconductor body via the resulting said at least one aperture.

11. A method as in claim 10, wherein said dopant is introduced by means of ion implantation, said composite layer masking the parts that it overlies against the implantation.

12. A method as in claim 1, wherein said basic mask has a number of windows formed therein and prior to providing said second material via said windows, doped semiconductor regions are formed by successive dopings, each time a part of said windows being closed by a material masking against the relevant doping.

* * * * *